United States Patent
Lim

(10) Patent No.: US 8,279,311 B2
(45) Date of Patent: Oct. 2, 2012

(54) RAMP GENERATORS AND IMAGE SENSORS INCLUDING THE SAME

(75) Inventor: Yong Lim, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 418 days.

(21) Appl. No.: 12/656,479

(22) Filed: Feb. 1, 2010

(65) Prior Publication Data

US 2010/0208112 A1    Aug. 19, 2010

(30) Foreign Application Priority Data

Feb. 13, 2009  (KR) .................. 10-2009-0011694

(51) Int. Cl.
*H04N 5/335* (2011.01)
*H03M 1/12* (2006.01)

(52) U.S. Cl. .................... 348/294; 348/312; 341/155

(58) Field of Classification Search .............. 348/294, 348/312, 321; 341/155, 166, 169, 172
See application file for complete search history.

(56) References Cited

U.S. PATENT DOCUMENTS

| 5,844,515 | A | * | 12/1998 | Park .......................... 48/E5.062 |
| 6,473,359 | B1 | * | 10/2002 | Mitarashi ................. 365/189.15 |
| 6,903,671 | B2 | | 6/2005 | Kwon et al. |
| 7,012,557 | B2 | * | 3/2006 | Takayanagi et al. .... 348/E5.091 |
| 7,741,988 | B2 | * | 6/2010 | Hattori ......................... 341/169 |
| 2002/0067303 | A1 | * | 6/2002 | Lee et al. ...................... 341/184 |

FOREIGN PATENT DOCUMENTS

KR   10-2004-0099887   12/2004

* cited by examiner

*Primary Examiner* — Nhan T Tran

(74) *Attorney, Agent, or Firm* — Harness, Dickey & Pierce, P.L.C.

(57) ABSTRACT

A ramp generator includes a row decoder, a column decoder, a current cell matrix and a current-voltage converter. The row decoder generates row selection signals, and the column decoder generates column selection signals. Each of current cells included in the current cell matrix is turned on to provide a unit current if a corresponding row selection signal and a corresponding column selection signal are activated. Each of the current cells is maintained to be turned on even if the corresponding row selection signal or the corresponding column selection signal is deactivated. The current cell matrix outputs an output current by summing unit currents provided from the current cells that are turned on. The current-voltage converter converts the output current of the current cell matrix into a ramp voltage. Therefore, the ramp generator may have a small size and prevent a glitch.

20 Claims, 7 Drawing Sheets

RAMP GENERATORS AND IMAGE SENSORS INCLUDING THE SAME

CROSS-REFERENCE TO RELATED APPLICATION(S)

This application claims priority under 35 U.S.C. §119 to Korean Patent Application No. 2009-0011694, filed on Feb. 13, 2009, in the Korean Intellectual Property Office (KIPO), the entire contents of which are incorporated herein by reference.

BACKGROUND

1. Technical Field

Example embodiments relate to ramp generators, and more particularly to glitch-free ramp generators and image sensors including the ramp generators.

2. Description of the Related Art

A ramp generator generates a ramp signal, for example, used as a reference signal in an analog-to-digital converter. The ramp generator may employ a current steering digital-to-analog converter to generate a ramp signal having a linear characteristic.

A conventional ramp generator employs a shift register or a current cell matrix as the digital-to-analog converter. The conventional ramp generator employing the shift register may have a large size since each current cell includes a flip-flop. Further, the conventional ramp generator may consume large power since the shift register operates in response to a clock signal. In the conventional ramp generator employing the current cell matrix, a glitch may occur when rows of turned-on current cells are changed.

SUMMARY

Example embodiments provide ramp generators having a small size and capable of preventing a glitch.

Example embodiments provide image sensors including the ramp generators.

According to at least some example embodiments, a ramp generator includes a row decoder, a column decoder, a current cell matrix and a current-to-voltage converter.

The row decoder generates row selection signals. The column decoder generates column selection signals. The current cell matrix includes current cells. Each of the current cells is turned on to provide a unit current when a corresponding row selection signal of the row selection signals and a corresponding column selection signal of the column selection signals are activated. The each of the current cells is maintained to be turned on even if the corresponding row selection signal or the corresponding column selection signal is deactivated. The current cell matrix outputs an output current by summing unit currents provided from the current cells that are turned on. The current-to-voltage converter converts the output current of the current cell matrix into a ramp voltage.

In at least some embodiments, the current cells may be sequentially turned on.

In at least some embodiments, the row selection signals may be sequentially activated, and the column selection signals may be sequentially activated while each of the row selection signals is activated.

In other embodiments, the column selection signals may be sequentially activated, and the row selection signals may be sequentially activated while each of the column selection signals is activated.

In at least some embodiments, the ramp voltage may increase as time elapses.

In other embodiments, the ramp voltage may decrease as time elapses.

In at least some embodiments, the current cells may be substantially simultaneously turned off in response to a reset signal.

In at least some embodiments, the each of the current cells may include a switching signal generating unit configured to activate a switching signal in response to the corresponding row selection signal and the corresponding column selection signal, and to maintain the switching signal active, and a unit current providing unit configured to provide the unit current in response to the switching signal.

In at least some embodiments, the switching signal generating unit may include a row selection transistor being turned on in response to the corresponding row selection signal, a column selection transistor serially coupled to the row selection transistor, the column selection transistor being turned on in response to the corresponding column selection signal, and a memory circuit configured to activate the switching signal when the row selection transistor and the column selection transistor are turned on, and to maintain the switching signal active.

In at least some embodiments, the memory circuit may include a first inverter and a second inverter, wherein an output terminal of the first inverter is coupled to an input terminal of the second inverter, and wherein an output terminal of the second inverter is coupled to an input terminal of the first inverter.

In at least some embodiments, the row selection transistor may have a first drain coupled to the input terminal of the first inverter, a first gate where the corresponding row selection signal is applied and a first source, and the column selection transistor may have a second drain coupled to the first source, a second gate where the corresponding column selection signal is applied and a second source coupled to a low power supply voltage.

In at least some embodiments, the row selection transistor and the column selection transistor may be n-channel metal oxide semiconductor transistors.

In other embodiments, the row selection transistor may have a first source coupled to a high power supply voltage, a first gate where an inverted version of the corresponding row selection signal is applied and a first drain, and the column selection transistor may have a second source coupled to the first drain, a second gate where an inverted version of the corresponding column selection signal is applied and a second drain coupled to the input terminal of the second inverter.

In other embodiments, the row selection transistor and the column selection transistor may be p-channel metal oxide semiconductor transistors.

In at least some embodiments, the switching signal generating unit further may include a reset transistor being turned on in response to a reset signal, and the memory circuit may deactivate the switching signal when the reset transistor is turned on.

In at least some embodiments, the switching signal generating unit may further include a column reset transistor being turned on in response to a column reset selection signal, and the memory circuit may deactivate the switching signal when the row selection transistor and the column reset transistor are turned on.

In at least some embodiments, the unit current providing unit may include a unit current source configured to provide the unit current, and a current providing switch configured to couple the unit current to the current-to-voltage converter in response to the switching signal.

In at least some embodiments, the unit current providing unit may further include a current blocking switch configured to couple the unit current to a current blocking path in response to an inverted version of the switching signal.

In at least some embodiments, the current-to-voltage converter may include an output load receiving the output current of the current cell matrix, and configured to generate the ramp voltage based on the output current.

According to at least some example embodiments, an image sensor includes a plurality of photo detecting elements, a row driver, a ramp generator, a counter, a comparator array, a latch array and a timing controller.

The photo detecting elements convert an incident light into an electrical signal. The row driver provides a driving signal to the photo detecting elements. The ramp generator generates a ramp voltage. The counter generates a counting signal corresponding to the ramp voltage. The comparator array compares the electrical signal with the ramp voltage. The latch array stores the counting signal in response to an output signal of the comparator array. The timing controller provides control signals to the row driver, the ramp generator, the counter, the comparator array and the latch array. The ramp generator includes a row decoder configured to generate row selection signals, a column decoder configured to generate column selection signals, a current cell matrix including current cells, each of the current cells being turned on to provide a unit current when a corresponding row selection signal of the row selection signals and a corresponding column selection signal of the column selection signals are activated, the each of the current cells being maintained to be turned on even if the corresponding row selection signal or the corresponding column selection signal is deactivated, the current cell matrix configured to output an output current by summing unit currents provided from the current cells that are turned on, and a current-to-voltage converter configured to convert the output current of the current cell matrix into the ramp voltage.

According to at least some example embodiments, the ramp generator and the image sensor may prevent a glitch since current cells are maintained to be turned on. Further, according to some example embodiments, the ramp generator and the image sensor may have a small size since a combinational logic circuit is not required in a current cell.

At least one example embodiment provides a ramp generator including a row decoder configured to generate row selection signals, a column decoder configured to generate column selection signals, a current cell matrix including current cells. Each of the current cells is configured to receive a corresponding row selection signal of the row selection signals and a corresponding column selection signal of the column selection signals, first output a current based on the corresponding row selection signal and the corresponding column selection signal having a first logic value, and maintain the output current if at least one of the corresponding row selection signal and the corresponding column selection signal is a second logic value, the current cell matrix configured to sum the output currents. The ramp generator also includes a current-to-voltage converter configured to convert the summed output current of the current cell matrix into a ramp voltage.

In at least another example embodiment an image sensor includes a ramp generator. The ramp generator includes a row decoder configured to generate row selection signals, a column decoder configured to generate column selection signals, a current cell matrix including current cells. Each of the current cells is configured to receive a corresponding row selection signal of the row selection signals and a corresponding column selection signal of the column selection signals, first output a current based on the corresponding row selection signal and the corresponding column selection signal having a first logic value, and maintain the output current if at least one of the corresponding row selection signal and the corresponding column selection signal is a second logic value, the current cell matrix configured to sum the output currents. The ramp generator also includes a current-to-voltage converter configured to convert the summed output current of the current cell matrix into a ramp voltage.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
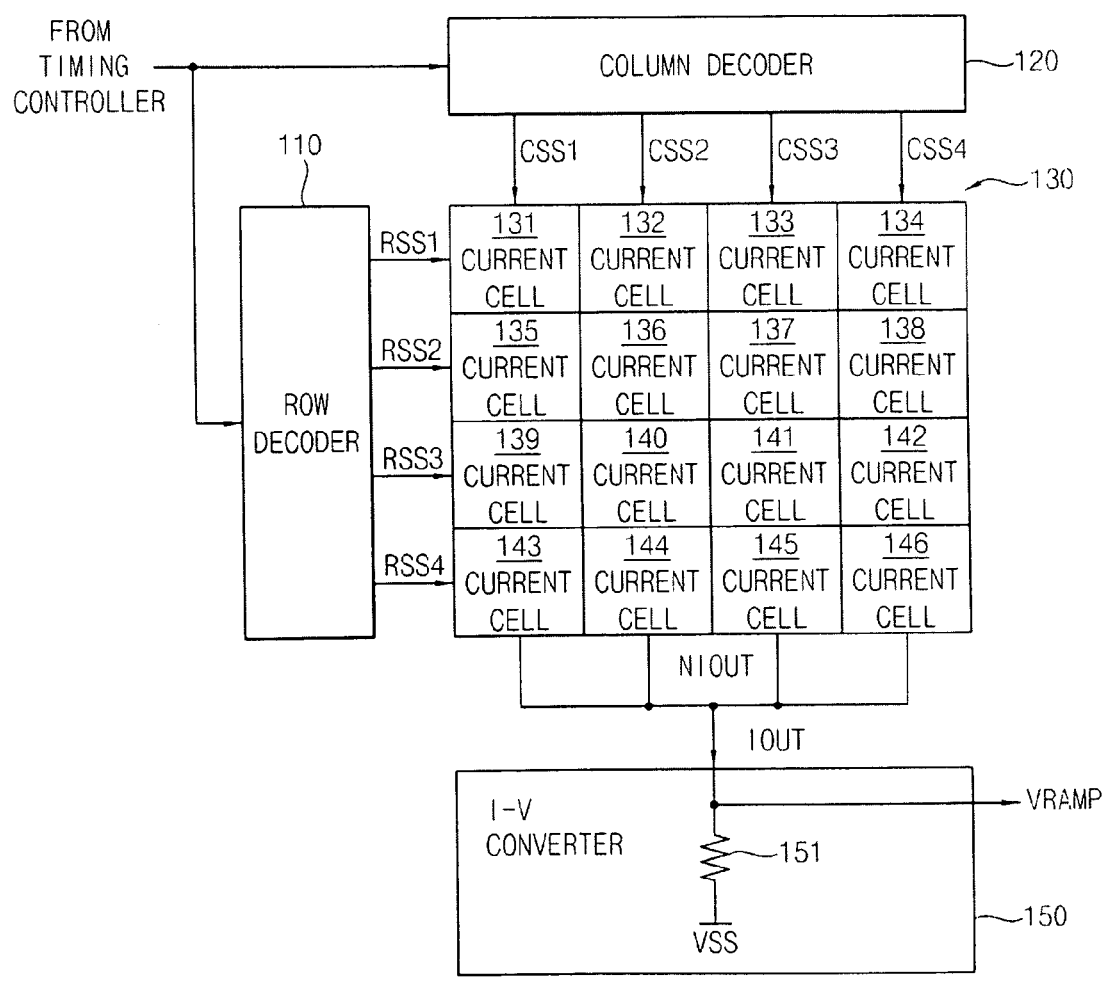
FIG. 1 is block diagram illustrating a ramp generator according to at least some example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is block diagram illustrating a ramp generator according to at least some example embodiments.

Referring to FIG. 1, a ramp generator 100 includes a row decoder 110, a column decoder 120, a current cell matrix 130 and a current-to-voltage converter 150.

The row decoder 110 generates a plurality of row selection signals RSS1, RSS2, RSS3 and RSS4, and the column decoder 120 generates a plurality of column selection signals CSS1, CSS2, CSS3 and CSS4. For example, the row decoder 110 and the column decoder 120 may generate the row selection signals RSS1, RSS2, RSS3 and RSS4 and the column selection signals CSS1, CSS2, CSS3 and CSS4 in response to a control signal provided from an external device, such as a timing controller. In at least some example embodiments, the row selection signals RSS1, RSS2, RSS3 and RSS4 may be sequentially activated, and the column selection signals CSS1, CSS2, CSS3 and CSS4 may be sequentially activated while each row selection signal RSS1-RSS4 is activated. In other example embodiments, the column selection signals CSS1, CSS2, CSS3 and CSS4 may be sequentially activated, and the row selection signals RSS1, RSS2, RSS3 and RSS4 may be sequentially activated while each column selection CSS1-CSS4 signal is activated.

The current cell matrix 130 includes a plurality of current cells 131 through 146. Each and every current cell 131 through 146 may be coupled to a current output node NIOUT. The current cell matrix 130 may provide the current-to-voltage converter 150 with the sum of unit currents output from the current cells 131 through 146 that are turned on. The current cells 131 through 146 may be sequentially turned on. Accordingly, the current cell matrix 130 may provide the current-to-voltage converter 150 with an output current IOUT increasing as time elapses.

Each of the current cells 131 through 146 may be turned on in response to a corresponding row selection signal of the row selection signals RSS1, RSS2, RSS3 and RSS4 and a corresponding column selection signal of the column selection signals CSS1, CSS2, CSS3 and CSS4. The current cells 131 through 146 are configured to provide substantially the same unit current amount as one another.

If a current cell 131-146 is turned on, the on current cell may continuously provide the unit current until the on current cell is reset. For example, when the first through the fourth column selection signals CSS1 through CSS4 are sequentially activated while the first row selection signal RSS1 is activated, the first through the fourth current cells 131 through 134 are sequentially turned on. At this time, even if the first column selection signal CSS1 is deactivated when the second column selection signal CSS2 is activated, the first current cell 131 is maintained to be turned on and continuously provides the unit current. Accordingly, the output current IOUT of the current cell matrix 130 may sequentially increase to four times the unit current. Then, the second row selection signal RSS2 is activated and the first through the fourth column selection signals CSS1 through CSS4 are sequentially activated. The fifth through the eighth current cells 135 through 138 are sequentially turned on. Accordingly, the output current IOUT of the current cell matrix 130 may sequentially increase from five to eight times the unit current. Similarly, when the third row selection signal RSS3 is activated and the first through the fourth column selection signals CSS1 through CSS4 are sequentially activated, the ninth through the twelfth current cells 139 through 142 are sequentially turned on. When the fourth row selection signal RSS4 is activated and the first through the fourth column selection signals CSS1 through CSS4 are sequentially activated, the thirteenth through the sixteenth current cells 143 through 146 are sequentially turned on. Accordingly, the output current IOUT of the current cell matrix 130 may sequentially increase from nine to sixteen times the unit current. As described above, the output current IOUT of the current cell matrix 130 may sequentially increase from one to sixteen times the unit current as time elapses.

Each of the current cells 131 through 146 may receive the same reset signal from an external device, such as a timing controller. The current cell matrix 130 is reset in response to the reset signal. That is, the current cells 131 through 146 may be substantially simultaneously turned off in response to the reset signal. When the current cells 131 through 146 are turned off, the current cells 131 through 146 may stop to provide the unit currents.

The current-to-voltage converter 150 converts the output current IOUT into a ramp voltage VRAMP. The current-to-voltage converter 150 may include an output load 151 coupled between the current output node NIOUT and a power supply voltage VSS. The output current IOUT may be applied to the output load 151, and the output load 151 may convert output current IOUT into the ramp voltage VRAMP. The output load 151 may be a resistive element, such as a resistor. In at least some example embodiments, the power supply voltage VSS may be a low power supply voltage or a ground voltage. In this case, the ramp voltage VRAMP may increase as time elapses. In other example embodiments, the output load 151 may be coupled between the current output node NIOUT and a high power supply voltage. In this case, the ramp voltage VRAMP may decrease as time elapses.

As described above, once each of the current cells 131 through 146 is turned on, each of the current cells 131 through 146 continuously provides the unit current until the current cell matrix 130 is reset. Accordingly, even if rows of current cells to be turned on are changed, the ramp generator 100 according to at least some example embodiments may prevent a glitch.

Figure 2:
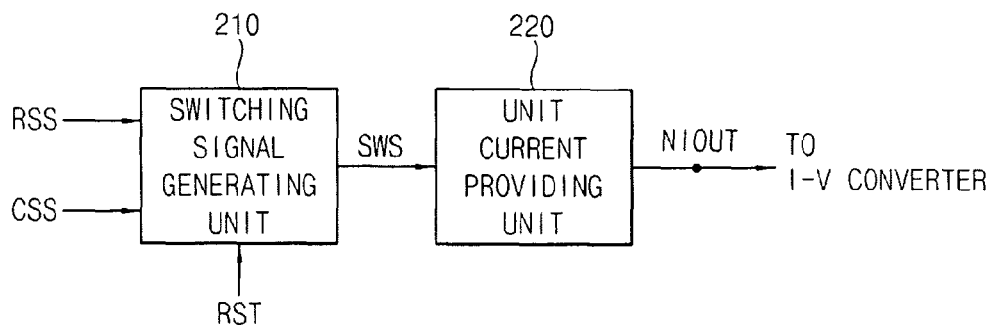
FIG. 2 is a block diagram illustrating a current cell included in the ramp generator of FIG. 1.

FIG. 2 is a block diagram illustrating a current cell included in the ramp generator of FIG. 1.

Referring to FIG. 2, a current cell 200 includes a switching signal generating unit 210 and a unit current providing unit 220. For example, the current cell 200 may be at least one of the first through the sixteenth current cells 131 through 146 illustrated in FIG. 1.

The switching signal generating unit 210 activates a switching signal SWS in response to a row selection signal RSS corresponding to one of the row selection signals RSS1-RSS4 and a column selection signal CSS corresponding to one of the column selection signals CSS1-CSS4. The switching signal generating unit 210 may receive the corresponding row selection signal RSS of the row selection signals RSS1, RSS2, RSS3 and RSS4 illustrated in FIG. 1 and the corresponding column selection signal CSS of the column selection signals CSS1, CSS2, CSS3 and CSS4 illustrated in FIG. 1. For example, if the current cell 200 is the first current cell 131 illustrated in FIG. 1, the row selection signal RSS may be the first row selection signal RSS1 illustrated in FIG. 1, and the column selection signal CSS may be the first column selection signal CSS1 illustrated in FIG. 1. The switching signal generating unit 210 may maintain the switching signal SWS active until a reset signal RST is applied.

The unit current providing unit 220 is coupled to the current output node NIOUT, and provides a unit current to the current-to-voltage converter 150 illustrated in FIG. 1 in response to the switching signal SWS. The unit current providing unit 220 may provide the unit current to the current-to-voltage converter 150 illustrated in FIG. 1 while the switching signal SWS is active. When the switching signal SWS is deactivated, the unit current providing unit 220 may stop to provide the unit current. In at least some example embodiments, the ramp generator 100 of FIG. 1 may include a current blocking path that prevents the unit current from flowing into the output load 151 illustrated in FIG. 1, and the unit current providing unit 220 may apply the unit current to the current blocking path to stop to provide the unit current to the current-to-voltage converter 150 illustrated in FIG. 1.

The switching signal generating unit 210 activates the switching signal SWS when both the row selection signal RSS and the column selection signal CSS are activated. Then, even if the row selection signal RSS and/or the column selection signal CSS are deactivated, the switching signal SWS may be maintained active. In a conventional ramp generator, when rows of current cells to be turned on are changed, an additional control signal is required to maintain a current cell to be turned on. Thus, a conventional current cell requires a combinational logic circuit for performing logic operations on a row selection signal, a, column selection signal and the additional control signal. Further, a glitch may occur in the conventional ramp generator when the rows are changed. However, in the current cell 200 according to at least some example embodiments, since the switching signal SWS is maintained active, the current cell 200 need not include the combinational logic circuit and the glitch may not occur.

Figure 3:
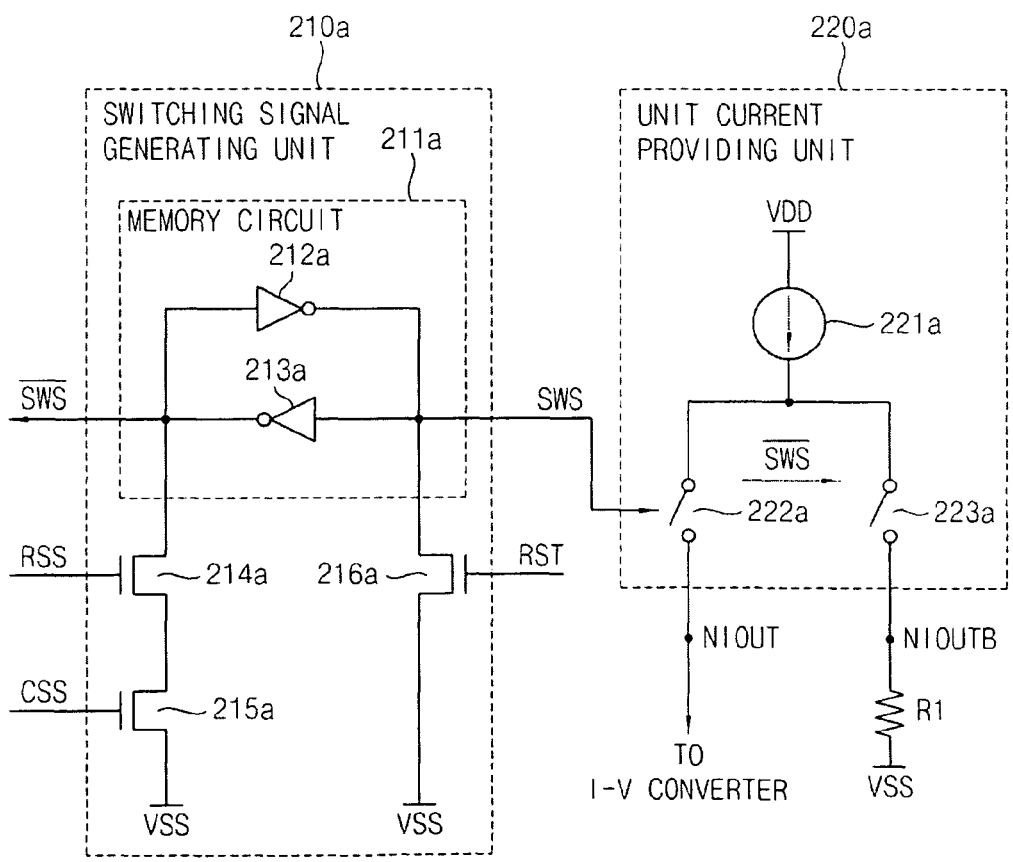
FIG. 3 is a circuit diagram illustrating an example of a current cell included in the ramp generator of FIG. 1.

FIG. 3 is a circuit diagram illustrating an example of a current cell included in the ramp generator of FIG. 1.

Referring to FIG. 3, a current cell 200a includes a switching signal generating unit 210a and a unit current providing unit 220a.

The switching signal generating unit 210a includes a memory circuit 211a, a row selection transistor 214a, a column selection transistor 215a and a reset transistor 216a. In at least some example embodiments, the memory circuit 211a may include a latch circuit having a first inverter 212a and a second inverter 213a.

The row selection transistor 214a may be turned on in response to a row selection signal RSS, and the column selection transistor 215a may be turned on in response to a column selection signal CSS. The row selection transistor 214a and the column selection transistor 215a may be serially coupled between an input terminal of the first inverter 212a and a low power supply voltage VSS. The row selection transistor 214a may have a first drain coupled to the input terminal of the first inverter 212a, a first gate where the row selection signal RSS is applied, and a first source. The column selection transistor 215a may have a second drain coupled to the first source, a second gate where the column selection signal CSS is applied, and a second source coupled to the low power supply voltage VSS. Alternatively, the column selection transistor 215a may be coupled to the input terminal of the first inverter 212a, and the row selection transistor 214a may be coupled between the column selection transistor 215a and the low power supply voltage VSS.

The memory circuit 211a activates a switching signal SWS when both the row selection signal RSS and the column selection signal CSS are activated, and maintains the switching signal SWS active. When the row selection signal RSS and the column selection signal CSS are activated, the row selection transistor 214a and the column selection transistor 215a are turned on. If the row selection transistor 214a and the column selection transistor 215a are turned on, a voltage having a logic low level is applied to the input terminal of the first inverter 212a. The first inverter 212a generates the switching signal SWS having a logic high level by inverting the voltage having the logic low level. That is, the first inverter 212a activates the switching signal SWS. The second inverter 213a generates an inverted switching signal /SWS having the logic low level by inverting the switching signal SWS having the logic high level. An output terminal of the first inverter 212a is coupled to an input terminal of the second inverter 213a, and an output terminal of the second inverter 213a is coupled to the input terminal of the first inverter 212a. Even if the row selection transistor 214a and/or the column selection transistor 215a are turned off, the first inverter 212a and the second inverter 213a having such a configuration may maintain the switching signal SWS and the inverted switching signal /SWS at the logic high level and the logic low level, respectively.

The reset transistor 216a is turned on in response to a reset signal RST. For example, the reset signal RST may be provided from an external device, such as a timing controller. If the reset signal RST is applied, the reset transistor 216a is turned on, the output terminal of the first inverter 212a is coupled to the low power supply voltage VSS, and the switching signal SWS has the low logic level. That is, the switching signal SWS is deactivated and the inverted switching signal /SWS is activated. As illustrated in FIG. 3, the switching signal generating unit 210a may be implemented with three transistors, and thus the switching signal generating unit 210a may have a small size.

The unit current providing unit 220a includes a unit current source 221a and a current providing switch 222a. The unit current source 221a provides a unit current. The current providing switch 222a may couple the unit current source 221a to the current-to-voltage converter 150, illustrated in FIG. 1, in response to the switching signal SWS. For example, when the switching signal SWS has the logic high level, the current providing switch 222a couples the unit current source 221a to the current-to-voltage converter 150, and thus the current cell 200a provides the unit current to the current-to-voltage converter 150.

The unit current providing unit 220a may further include a current blocking switch 223a. The current blocking switch 223a may couple the unit current source 221a to a current blocking path in response to the inverted switching signal /SWS. The current blocking path may include a resistor R1 coupled between a current blocking node NIOUTB and the low power supply voltage VSS. For example, when the inverted switching signal /SWS has the logic high level, the current blocking switch 223a couples the unit current source 221a to the current blocking path, and the current cell 200a does not provide the unit current to the current-to-voltage converter 150. Since the unit current source 221a need not to be turned off, an initialization operation for turning on the unit current source 221a is not required once the unit current source 221a is turned on. In at least some example embodiments, the current cells 131 through 146 illustrated in FIG. 1 may be coupled to the current blocking node NIOUTB.

As described above, since the memory circuit 211a maintains the switching signal SWS active, the current cell 200a according to at least some example embodiments does not include an additional combinational logic circuit and may prevent a glitch.

Figure 4:
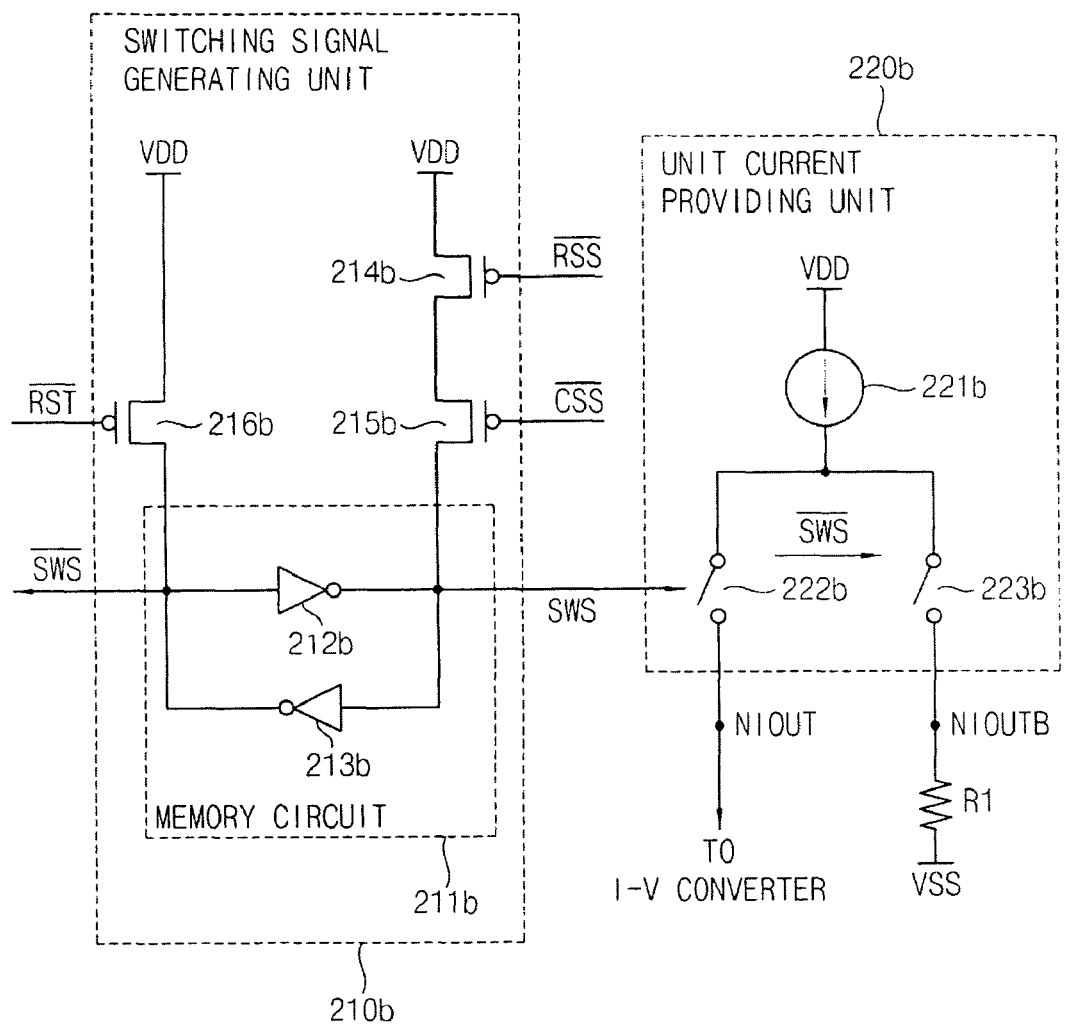
FIG. 4 is a circuit diagram illustrating another example of a current cell included in the ramp generator of FIG. 1.

FIG. 4 is a circuit diagram illustrating another example of a current cell included in the ramp generator of FIG. 1.

Referring to FIG. 4, a current cell 200b includes a switching signal generating unit 210b and a unit current providing unit 220b. The switching signal generating unit 210b includes a memory circuit 211b, a row selection transistor 214b, a column selection transistor 215b and a reset transistor 216b. In at least some example embodiments, the memory circuit 211b may include a latch circuit having a first inverter 212b and a second inverter 213b. The unit current providing unit 220b includes a unit current source 221b, a current providing switch 222b and a current blocking switch 223b.

The row selection transistor 214b and the column selection transistor 215b may be serially coupled between a high power supply voltage VDD and an input terminal of the second inverter 213b. The row selection transistor 214b may have a first source coupled to the high power supply voltage VDD, a first gate where an inverted row selection signal /RSS is applied, and a first drain. The column selection transistor 215b may have a second source coupled to the first drain, a second gate where an inverted column selection signal /CSS is applied, and a second drain coupled to the input terminal of the second inverter 213b. Alternatively, the column selection transistor 215b may be coupled to the high power supply voltage VDD, and the row selection transistor 214b may be coupled between the column selection transistor 215b and the input terminal of the second inverter 213b.

When the inverted row selection signal /RSS and the inverted column selection signal /CSS have logic low levels, the row selection transistor 214b and the column selection transistor 215b are turned on. If the row selection transistor 214b and the column selection transistor 215b are turned on, a switching signal SWS has a logic high level. The memory circuit 211b may maintain the switching signal SWS at the logic high level even if the row selection transistor 214b and/or the column selection transistor 215b are turned off. The current providing switch 222b may couple the unit current source 221b to the current-to-voltage converter 150, illustrated in FIG. 1, and the current cell 200b may provide a unit current to the current-to-voltage converter 150.

The reset transistor 216b is turned on in response to an inverted reset signal /RST. When the inverted reset signal /RST has the logic low level, the reset transistor 216b is turned on, an input terminal of the first inverter 212b is coupled to the high power supply voltage VDD, and the switching signal SWS has the low logic level. That is, the switching signal SWS is deactivated and the inverted switching signal /SWS is activated. The current providing switch 222b is turned off in response to the deactivated switching signal SWS, and the current blocking switch 223b is turned on in response to the activated inverted switching signal /SWS. The current blocking switch 223b couples the unit current source 221b to a current blocking path, and the current cell 200b does not provide the unit current to the current-to-voltage converter 150.

Figure 5:
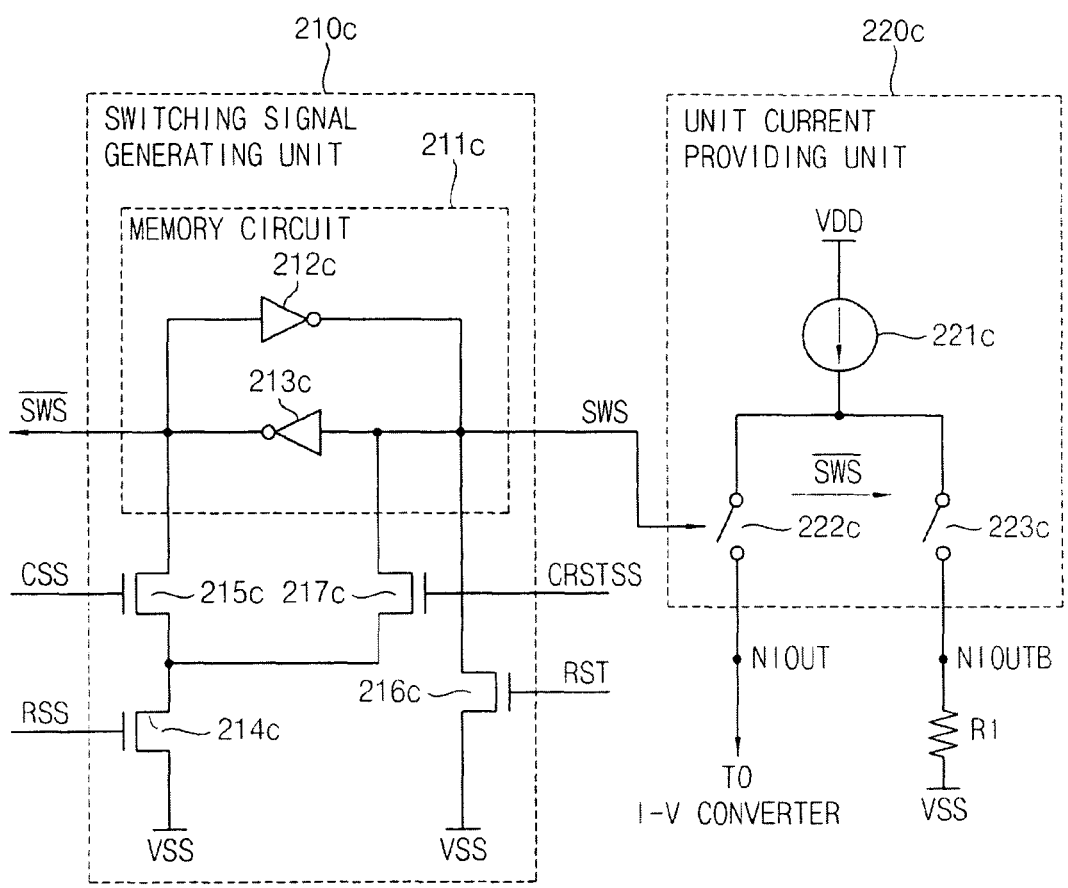
FIG. 5 is a circuit diagram illustrating another example of a current cell included in the ramp generator of FIG. 1.

FIG. 5 is a circuit diagram illustrating still another example of a current cell included in the ramp generator of FIG. 1.

Referring to FIG. 5, a current cell 200c includes a switching signal generating unit 210c and a unit current providing unit 220c. The switching signal generating unit 210c includes a memory circuit 211c, a row selection transistor 214c, a column selection transistor 215c and a reset transistor 216c. In at least some example embodiments, the memory circuit 211c may include a latch circuit having a first inverter 212c and a second inverter 213c. The unit current providing unit 220c includes a unit current source 221c, a current providing switch 222c and a current blocking switch 223c.

The switching signal generating unit 210c may further include a column reset transistor 217c. The column reset transistor 217c is turned on in response to a column reset selection signal CRSTSS. For example, the column reset selection signal CRSTSS may be provided from the column decoder 120 illustrated in FIG. 1.

The column reset transistor 217c may be coupled between an output terminal of the first inverter 212c and the row selection transistor 214c. When the column reset selection signal CRSTSS has a logic high level and a row selection signal RSS has the logic high level, the column reset transistor 217c and the row selection transistor 214c are turned on. If the column reset transistor 217c and the row selection transistor 214c are turned on, the current cell 200c does not provide a unit current to the current-to-voltage converter 150 illustrated in FIG. 1.

The current cell 200c may be turned off in response to a reset signal RST or in response to the row selection signal RSS and the column reset selection signal CRSTSS. The reset signal RST may be simultaneously applied to the current cells 131 through 146 illustrated in FIG. 1, and the row selection signal RSS and the column reset selection signal CRSTSS may be applied to only a selected current cell. Thus, the current cells 131 through 146 may be simultaneously turned off, or only the selected current cell of the current cells 131 through 146 may be turned off.

Figure 6:
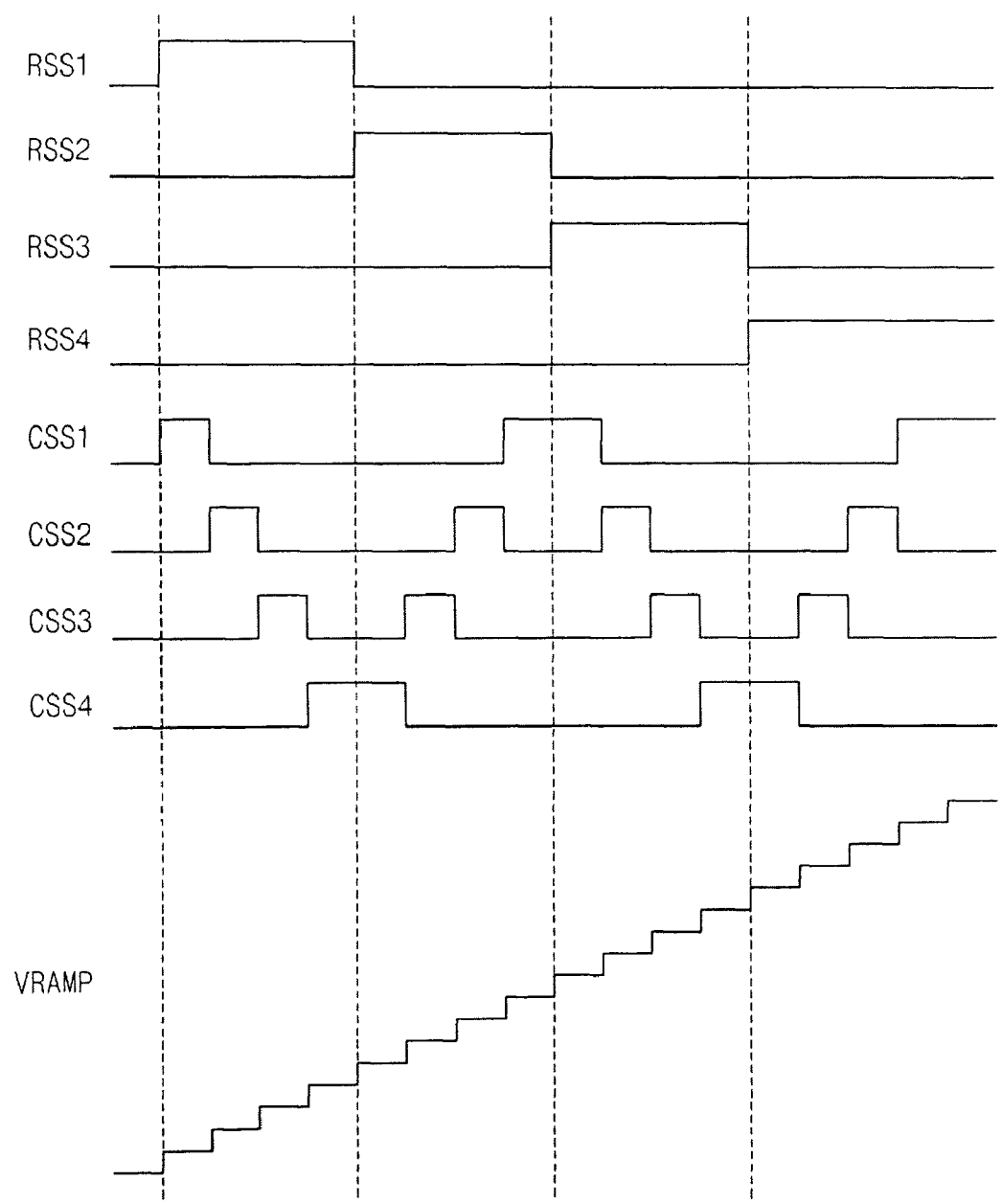
FIG. 6 is a timing diagram for illustrating operations of a ramp generator of FIG. 1.

FIG. 6 is a timing diagram for illustrating operations of the ramp generator of FIG. 1.

Referring to FIGS. 1 and 6, the ramp generator 100 may generate a ramp voltage VRAMP increasing at time increases. A plurality of column selection signals CSS1, CSS2, CSS3 and CSS4 may be sequentially activated while each row selection signal is activated. In at least some example embodiments, the sum of pulse widths of first through fourth column selection signals CSS1, CSS2, CSS3 and CSS4 may be substantially the same as a pulse width of one of first through fourth row selection signals RSS1, RSS2, RSS3 and RSS4.

When the first row selection signal RSS1 and the first column selection signal CSS1 are activated, the first current cell 131 is turned on. Accordingly, the ramp voltage VRAMP may have a voltage level corresponding to a unit current. When the second through the fourth column selection signals CSS2, CSS3 and CSS4 are sequentially activated while the first row selection signal RSS1 is activated, the second through the fourth current cells 132, 133 and 134 are sequentially turned on. Accordingly, the ramp voltage VRAMP may have voltage levels sequentially increasing from two to four times the unit current.

While the second row selection signal RSS2 is activated, the fourth column selection signal CSS4, the third column selection signal CSS3, the second column selection signal CSS2 and the first column selection signal CSS1 may be sequentially activated. Alternatively, the first column selection signal CSS1, the second column selection signal CSS2, the third column selection signal CSS3 and the fourth column selection signal CSS4 may be sequentially activated while the second row selection signal RSS2 is activated. The ramp voltage VRAMP may have voltage levels sequentially increasing from five to eight times the unit current when the second row selection signal RSS2 is activated. Similarly, when the third row selection signal RSS3 and the fourth row selection signal RSS4 are sequentially activated, the ramp voltage VRAMP may have voltage levels sequentially increasing from nine to sixteen times the unit current.

Accordingly, the ramp generator 100 may increase the ramp voltage VRAMP as time elapses.

Figure 7:
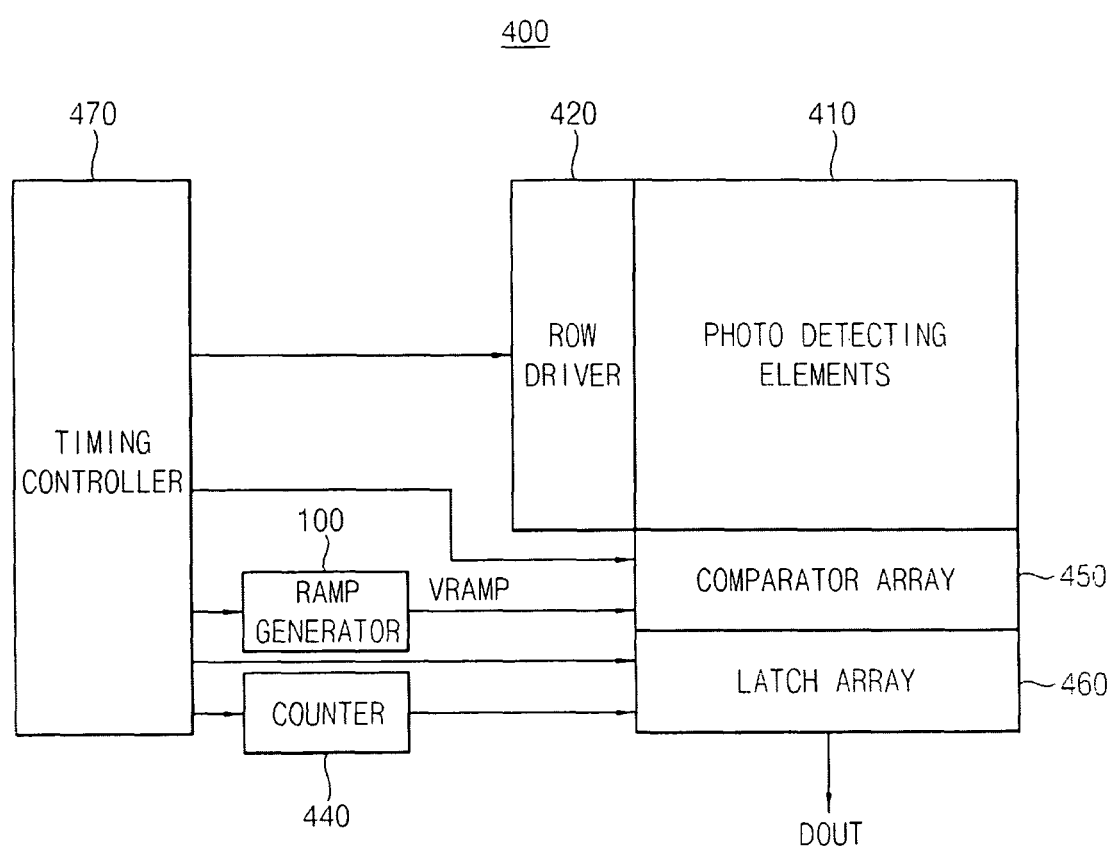
FIG. 7 is a block diagram illustrating an image sensor according to at least some example embodiments.

FIG. 7 is a block diagram illustrating an image sensor according to at least some example embodiments.

Referring to FIG. 7, an image sensor 400 includes a plurality of photo detecting elements 410, a row driver 420, the ramp generator 100, a counter 440 and a comparator array 450, a latch array 460 and a timing controller 470.

The photo detecting elements 410 may convert an incident light into an electrical signal. For example, each of the photo detecting elements 410 may include a photo diode, a photo transistor, a photo gate, a pinned photo diode, or a combination thereof. In some embodiments, each of the photo detecting elements 410 may have a four-transistor configuration including a photo diode, a transfer transistor, a reset transistor, an amplification transistor and a select transistor. Alternatively, each of the photo detecting elements 410 may have a one-transistor configuration, a three-transistor configuration or a five-transistor configuration. Parts of the transistors may be shared by the photo detecting elements 410.

The row driver 420 is electrically coupled to rows of the photo detecting elements 410, and provides driving signals to the photo detecting elements 410. The row driver 420 may provide the driving signals to the photo detecting elements 410 row by row.

The ramp generator 100 generates a ramp voltage VRAMP. The comparator array 450 is electrically coupled to columns of the photo detecting elements 410, and receives the electrical signal from the photo detecting elements 410 and the ramp voltage VRAMP from the ramp generator 100. The comparator array 450 may compare the electrical signal with the ramp voltage VRAMP. In some embodiments, the comparator array 450 may perform a correlated double sampling (CDS) operation for reducing a noise. The image sensor 400 may further include a CDS circuit that extracts a data signal from a difference between the electrical signal and a reference signal.

The counter 440 may generate a counting signal. The counter 440 may start to count when the ramp generator 100 generates the ramp voltage VRAMP. The counter 440 may increase the counting signal when the ramp voltage VRAMP increases. The latch array 460 may store the counting signal in response to an output signal of the comparator array 450. The latch array 460 may output the stored counting signal as output data DOUT. In some embodiments, the image sensor 400 may further include an interpolator for interpolating the output data DOUT, and a data processing unit for processing the output data DOUT.

The timing controller 470 may control operation timings of the row driver 420, the ramp generator 100, the counter 440, the comparator array 450 and the latch array 460. The timing controller 470 may provide timing signals and control signals to the row driver 420, the ramp generator 100, the counter 440, the comparator array 450 and the latch array 460.

Figure 8:
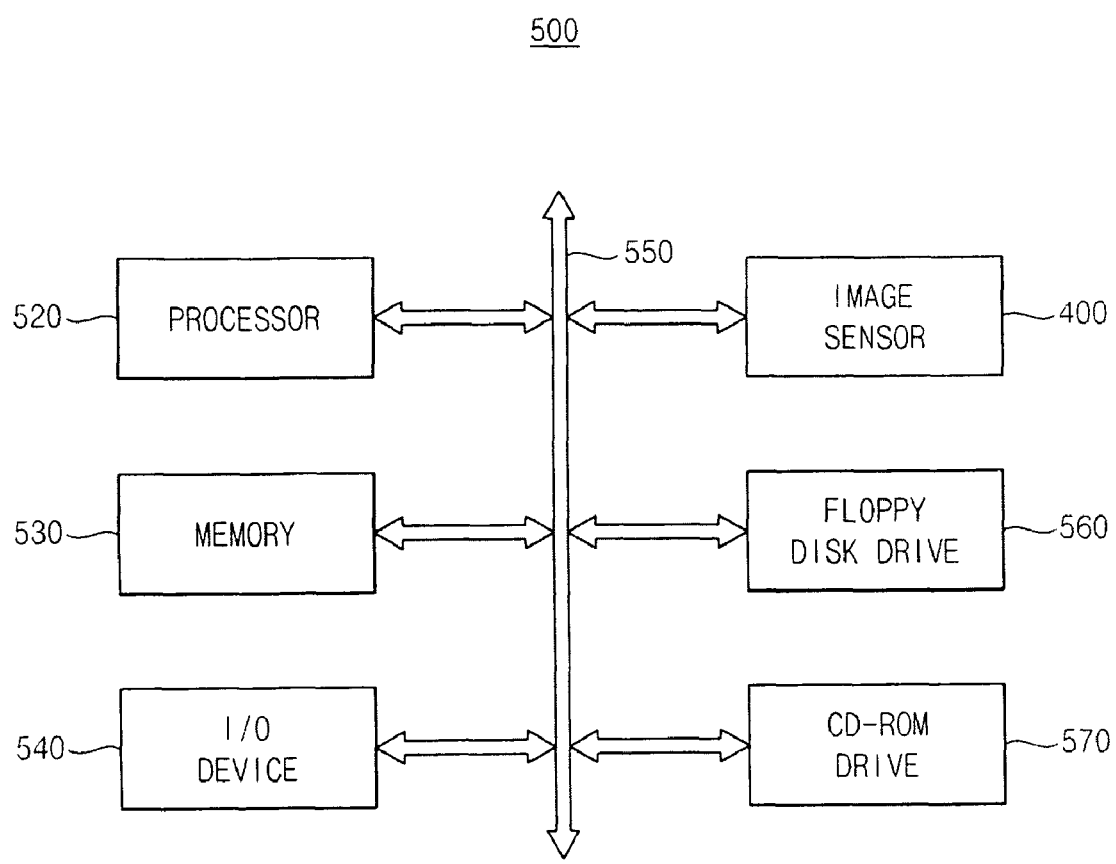
FIG. 8 is a block diagram illustrating a system according to at least some example embodiments.

FIG. 8 is a block diagram illustrating a system according to at least some example embodiments.

Referring to FIG. 8, a system 500 includes the image sensor 400. The system 500 may further include a processor 520, a memory device 530, an input/output device 540 and a bus 550.

The processor 520 may perform various computing functions, such as executing specific software for performing specific calculations or tasks. For example, the processor 520 may be a microprocessor or a central process unit (CPU). The processor 520 may be coupled to the memory device 530 via the bus 550, such as an address bus, a control bus or a data bus, etc. For example, the memory device 530 may be a dynamic random access memory (DRAM), a static random access memory (SRAM), or a non-volatile memory, such as an erasable programmable read-only memory (EPROM), an electrically erasable programmable read-only memory (EEPROM), or the like. The processor 520 may be coupled to an expansion bus, such as a peripheral-component-interconnect (PCI) bus. The processor 520 may control the input/output device 540, such as a keyboard, a mouse, a printer, a display device, etc. The system 500 may further include a storage device, such as a floppy disk drive 560, a compact disk read-only memory (CD-ROM) drive 570, a hard disk drive, etc. The image sensor 400 may be constructed as an integrated circuit. In at least some example embodiments, the image sensor 400 may be combined with a processor, such as a CPU, a digital signal processor or a microprocessor, with or without memory storage in a single integrated circuit, or may be on a different chip than the processor.

The system 500 may be applicable to any computing system, such as a computer system, a camera system, a scanner system, a navigation system, a mobile phone, a monitoring system, an auto focusing system, a tracking system, a motion detecting system, an image stabilization system, or the like.

As described above, the ramp generator and the image sensor according to at least some example embodiments may prevent a glitch. Further, the ramp generator and the image sensor according to at least some example embodiments may have a small size since the current cell is not required to include additional combinational logic circuits.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A ramp generator, comprising:
a row decoder configured to generate row selection signals;
a column decoder configured to generate column selection signals;
a current cell matrix including current cells,
each of the current cells being configured to,
receive a corresponding row selection signal of the row selection signals and a corresponding column selection signal of the column selection signals,
first output a current based on the corresponding row selection signal and the corresponding column selection signal having a first logic value, and maintain the output current if at least one of the corresponding row selection signal and the corresponding column selection signal is a second logic value, the current cell matrix configured to sum the output currents; and a current-to-voltage converter configured to convert the summed output current of the current cell matrix into a ramp voltage.

2. The ramp generator of claim 1, wherein the current cells are sequentially turned on.

3. The ramp generator of claim 1, wherein the row selection signals are sequentially activated and the column selection signals are sequentially activated while each of the row selection signals is activated.

4. The ramp generator of claim 1, wherein the column selection signals are sequentially activated and the row selection signals are sequentially activated while each of the column selection signals is activated.

5. The ramp generator of claim 1, wherein the ramp voltage increases as time elapses.

6. The ramp generator of claim 1, wherein the ramp voltage decreases as time elapses.

7. The ramp generator of claim 1, wherein the current cells are configured to be substantially simultaneously turned off in response to a reset signal.

8. The ramp generator of claim 1, wherein each of the current cells includes,
a switching signal generating unit configured to output a switching signal based on the corresponding row selection signal and the corresponding column selection signal, and to maintain a first value of the switching signal if the logic value of at least one the corresponding row selection signal and the corresponding column selection signal changes; and
a unit current providing unit configured to output the current in response to the switching signal.

9. The ramp generator of claim 8, wherein the switching signal generating unit includes,
a row selection transistor configured to be turned on in response to the corresponding row selection signal;
a column selection transistor coupled to the row selection transistor and configured to be turned on in response to the corresponding column selection signal; and
a memory circuit configured to output the switching signal having the first value if the row selection transistor and the column selection transistor are on.

10. The ramp generator of claim 9, wherein the memory circuit includes a first inverter and a second inverter, wherein
an output terminal of the first inverter is coupled to an input terminal of the second inverter, and
an output terminal of the second inverter is coupled to an input terminal of the first inverter.

11. The ramp generator of claim 10, wherein
the row selection transistor includes a first drain coupled to the input terminal of the first inverter, a first gate configured to receive the corresponding row selection signal, and a first source, and
the column selection transistor includes a second drain coupled to the first source, a second gate configured to receive the corresponding column selection signal, and a second source coupled to a low power supply voltage.

12. The ramp generator of claim 11, wherein the row selection transistor and the column selection transistor are n-channel metal oxide semiconductor transistors.

13. The ramp generator of claim 10, wherein
the row selection transistor includes a first source coupled to a high power supply voltage, a first gate configured to receive an inverted corresponding row selection signal, and a first drain, and
the column selection transistor includes a second source coupled to the first drain, a second gate configured to receive an inverted corresponding column selection signal, and a second drain coupled to the input terminal of the second inverter.

14. The ramp generator of claim 13, wherein the row selection transistor and the column selection transistor are p-channel metal oxide semiconductor transistors.

15. The ramp generator of claim 9, wherein
the switching signal generating unit further includes a reset transistor configured to be turned on in response to a reset signal, and
the memory circuit is configured to output the switching signal having a second value if the reset transistor is on.

16. The ramp generator of claim 9, wherein
the switching signal generating unit further includes a column reset transistor configured to be turned on in response to a column reset selection signal, and
the memory circuit is configured to output the switching signal having a second value if the row selection transistor and the column reset transistor are on.

17. The ramp generator of claim 8, wherein the unit current providing unit includes,
a unit current source configured to provide the current; and
a current providing switch configured to output the current to the current-to-voltage converter in response to the switching signal.

18. The ramp generator of claim 17, wherein the unit current providing unit further includes,
a current blocking switch configured to output the current to a current blocking path in response to an inverted switching signal.

19. The ramp generator of claim 1, wherein the current-to-voltage converter includes,
an output load configured to receive the summed output current and generate the ramp voltage based on the output current.

20. An image sensor, comprising:
a plurality of photo detecting elements configured to convert an incident light into an electrical signal;
a row driver configured to provide a driving signal to the photo detecting elements;
the ramp generator of claim 1;
a counter configured to generate a counting signal corresponding to the ramp voltage;
a comparator array configured to compare the electrical signal with the ramp voltage;
a latch array configured to store the counting signal in response to an output signal of the comparator array; and
a timing controller configured to provide control signals to the row driver, the ramp generator, the counter, the comparator array and the latch array.

* * * * *